(12) United States Patent
Yang et al.

(10) Patent No.: US 9,684,745 B2
(45) Date of Patent: *Jun. 20, 2017

(54) DIGITALLY CALIBRATED VOLTAGE REGULATORS FOR POWER MANAGEMENT

(71) Applicant: Monolithic Power Systems, Inc., San Jose, CA (US)

(72) Inventors: Eric Yang, Saratoga, CA (US); Michael Hsing, Saratoga, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/365,638

(22) Filed: Nov. 30, 2016

(65) Prior Publication Data

US 2017/0083649 A1 Mar. 23, 2017

Related U.S. Application Data

(63) Continuation of application No. 13/791,480, filed on Mar. 8, 2013, now Pat. No. 9,541,973.

(60) Provisional application No. 61/712,659, filed on Oct. 11, 2012.

(51) Int. Cl.
*G01D 18/00* (2006.01)
*G06F 17/50* (2006.01)
*G05F 1/575* (2006.01)

(52) U.S. Cl.
CPC .......... *G06F 17/5009* (2013.01); *G05F 1/575* (2013.01)

(58) Field of Classification Search
CPC ...... G05B 19/0423; G05B 2219/21065; G06F 1/26; H02M 3/157; H02M 3/1584; G01R 31/40
USPC .......... 702/57, 64, 65, 85, 86; 323/266, 283, 323/349
See application file for complete search history.

(56) References Cited

U.S. PATENT DOCUMENTS

| | | | |
|---|---|---|---|
| 5,534,782 A * | 7/1996 | Nourse | H02H 11/005 324/500 |
| 6,900,621 B1 * | 5/2005 | Gunther | G05F 1/573 323/266 |
| 9,000,786 B2 * | 4/2015 | Luo | G06F 1/26 324/750.01 |

* cited by examiner

*Primary Examiner* — An Do
(74) *Attorney, Agent, or Firm* — Okamoto & Benedicto LLP

(57) ABSTRACT

A computer provides a graphical user interface for displaying a virtual representation of a voltage regulator and for accepting a user requirement for the voltage regulator. The computer automatically determines an internal calibration setting of the voltage regulator that meets the user requirement. The computer simulates operation of the voltage regulator as calibrated with the internal calibration setting. The internal calibration setting is downloaded to the voltage regulator. A calibration controller of the voltage regulator receives the internal calibration setting and outputs digital calibration bits in accordance with the internal calibration setting. The digital calibration bits works in conjunction with interface circuits to adjust circuits of a voltage regulator core to digitally calibrate the voltage regulator.

15 Claims, 9 Drawing Sheets

DIGITALLY CALIBRATED VOLTAGE REGULATORS FOR POWER MANAGEMENT

CROSS-REFERENCE TO RELATED APPLICATION

The present application is a continuation of U.S. application Ser. No. 13/791,480, filed on Mar. 8, 2013, now U.S. Pat. No. 9,541,973, which claims the benefit of U.S. Provisional Application No. 61/712,659, filed on Oct. 11, 2012, both of which are incorporated herein by reference in their entirety.

BACKGROUND OF THE INVENTION

1. Field of the Invention

The present invention relates generally to power management, and more particularly but not exclusively to voltage regulators.

2. Description of the Background Art

Power management for electronic devices, such as computers, mobile phones, digital music players, and the like, involves the use of a voltage regulator to provide a tightly regulated supply voltage. A popular voltage regulator employed in electronic devices is a DC-DC (direct current-to-direct current) converter. The DC-DC converter is provided by its vendor in integrated circuit (IC) form. To save on design and manufacturing costs, as well as to shorten time to market, the DC-DC converter is designed to operate in a variety of conditions to meet different customer requirements. For each customer or application, a DC-DC converter thus needs to be manually calibrated to meet particular user requirements, such as, for example, output voltage and switching frequency. The manual calibration procedure is not trivial, and typically requires electrical engineers with experience in power management and in using the particular DC-DC converter.

SUMMARY

In one embodiment, a computer provides a graphical user interface for displaying a virtual representation of a voltage regulator and for accepting a user requirement for the voltage regulator. The computer automatically determines an internal calibration setting of the voltage regulator that meets the user requirement. The computer simulates operation of the voltage regulator as calibrated with the internal calibration setting. The internal calibration setting is downloaded to the voltage regulator. A calibration controller of the voltage regulator receives the internal calibration setting and outputs digital calibration bits in accordance with the internal calibration setting. The digital calibration bits works in conjunction with interface circuits to adjust circuits of a voltage regulator core to digitally calibrate the voltage regulator.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
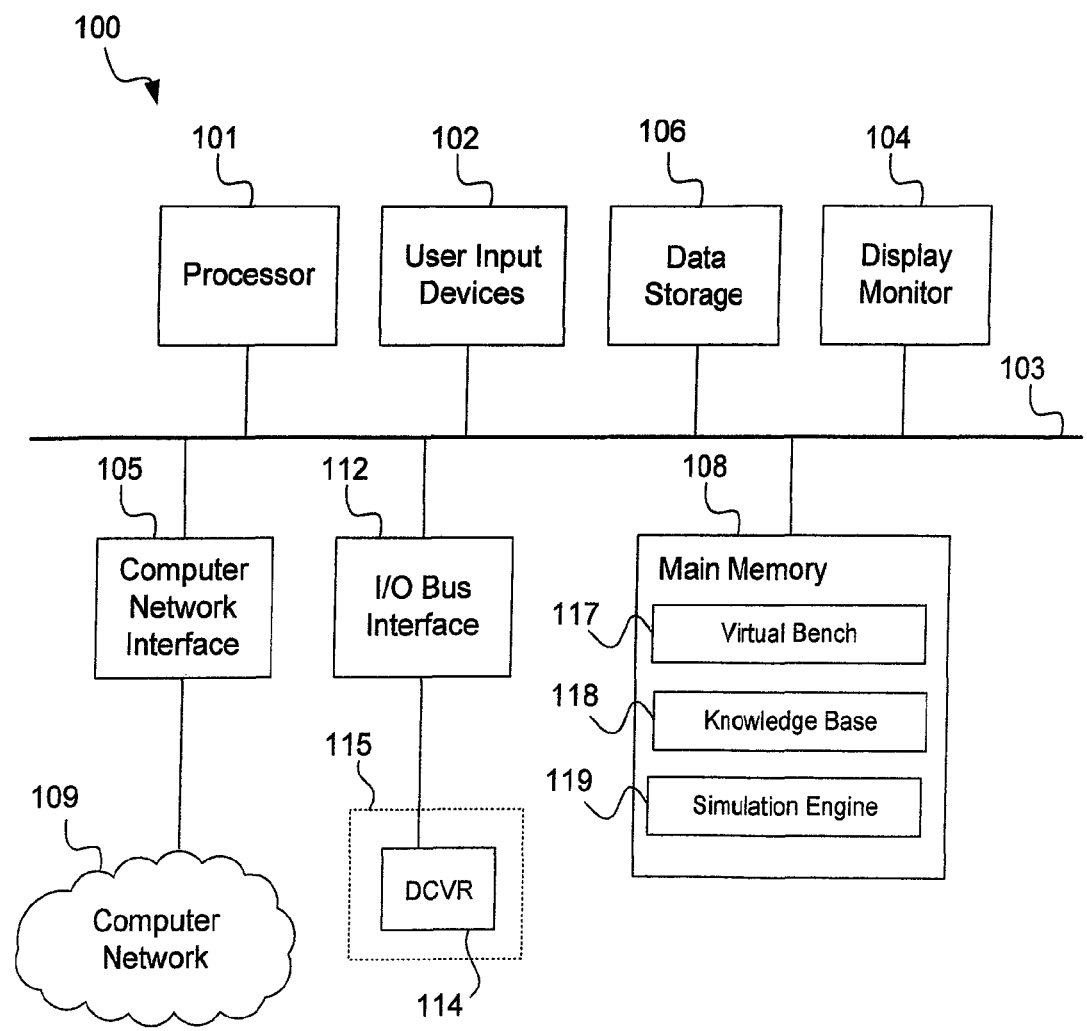
FIG. 1 shows a schematic diagram of a computer in accordance with an embodiment of the present invention.

FIG. 1 shows a schematic diagram of a computer 100 in accordance with an embodiment of the present invention. The computer 100 may be employed by a user, who is typically an electrical engineer, to digitally calibrate a voltage regulator to meet particular user requirements. The computer 100 may have fewer or more components without detracting from the merits of the present invention.

In the example of FIG. 1, the computer 100 includes a processor 101 and one or more buses 103 coupling its various components. The computer 100 may include one or more user input devices 102 (e.g., keyboard, mouse), one or more data storage devices 106 (e.g., hard drive, optical disk, Universal Serial Bus memory), a display monitor 104 (e.g., liquid crystal display, flat panel monitor, cathode ray tube), a computer network interface 105 (e.g., network adapter, modem), and a main memory 108 (e.g., random access memory). The computer network interface 105 may be coupled to a computer network 109.

In the example of FIG. 1, the computer 100 includes an input/output (I/O) bus interface 112. The I/O bus interface 112 may comprise a universal serial bus (USB) interface, for example. A digitally calibrated voltage regulator ("DCVR") 114 may be coupled to the computer 100 by way of the I/O bus interface 112. For example, the voltage regulator 114 may be mounted to a circuit board 115 (e.g., power management board, fixture, calibration board) that converts USB communications to I2C bus communications supported by the voltage regulator 114.

The computer 100 is a particular machine as programmed with software modules, which in the example of FIG. 1 includes a virtual bench 117, a knowledge base 118, and a simulation engine 119. The aforementioned software modules comprise computer-readable program code stored non-transitory in the main memory 108 for execution by the processor 101. The computer 100 may be configured to perform its functions by executing the software modules. The software modules may be loaded from the data storage device 106 to the main memory 108. An article of manufacture may be embodied as computer-readable storage medium including instructions that when executed by a computer causes the computer to be operable to perform the functions of the software modules.

The virtual bench 117 may comprise computer-readable program code that provides a graphical user interface (GUI) for digitally calibrating the voltage regulator 114. In one embodiment, the digital calibration involves adjusting a circuit of a voltage regulator core of the voltage regulator 114 to set electrical values (e.g., resistance, capacitance, reference voltage, threshold voltage) in the voltage regulator. The selection of electrical values does not necessarily change the topology of the voltage regulator. In one embodiment, the selection of electrical values changes operating characteristics of the voltage regulator to optimize the operation of the voltage regulator to meet particular requirements, such as output voltage, switching frequency, and other characteristics typically changeable in a voltage regulator by manual selection of electrical values and manual installation of additional components. Depending on the application, in other embodiments, the calibration may also involve changing the topology of the voltage regulator.

The virtual bench 117 may provide graphical elements that virtually represent test and measurement instruments typically employed by an electrical engineer in calibrating a voltage regulator, including meters, oscilloscopes, power supply, and the like. The virtual bench 117 may provide a virtual representation of the voltage regulator being calibrated, and also display data pertaining to the calibration, including Bode plots, for example. The virtual bench 117 may be implemented using conventional programming methodology, including object oriented programming techniques. The virtual bench 117 may receive user requirements for the voltage regulator being calibrated including output voltage, switching frequency, protection thresholds, and other user requirements. The requirements may be entered by the user by selecting components, electrical values, output voltage, switching frequency, and other parameters in the virtual bench 117.

The simulation engine 118 may comprise computer-readable program code that simulates the operation of a voltage regulator that is virtually represented by the virtual bench 117. The simulation engine 118 may simulate the operation of the voltage regulator by receiving the user requirements from the virtual bench 117, and determining the resulting behavior of the voltage regulator when operated in accordance with the user requirements. The simulation engine 118 may determine the resulting behavior and characteristics of the voltage regulator using equations, tabular data, and other application design guidelines for the voltage regulator.

The application design guidelines for a voltage regulator may be incorporated in the knowledge base 118. The knowledge base 118 may be an expert system, for example. The knowledge base 118 may reflect the knowledge of experts in the voltage regulator, including knowledge of its designers and vendor field application engineers. The application design guidelines indicate the effect of particular component, electrical value, switching frequency, output voltage, start-up time, protection thresholds, or other parameter to the operation of the voltage regulator. The simulation engine 118 may consult with the knowledge base 118 to determine the resulting operation of the voltage regulator for particular selections. The knowledge base 118 may also generate or retrieve internal calibration settings for digitally calibrating the voltage regulator to meet particular user requirements. The internal calibration settings may be in the form of calibration bits that adjust circuits of the voltage regulator 114.

As a particular example, the output voltage of the voltage regulator 114 may be changed by appropriate selection of a reference voltage value. The vendor, i.e., the maker of the voltage regulator 114, provides an equation relating the reference voltage value to output voltage. This equation may be incorporated in the knowledge base 118. The user may enter his desired output voltage in the virtual bench 117. The simulation engine 119 receives the desired output voltage, consults the knowledge base 118 to determine the corresponding reference voltage value, and simulates operation of the voltage regulator 114 as calibrated with the reference voltage value. The voltage regulator 114 may be subsequently digitally calibrated to have the reference value by receiving and effecting internal calibration settings, such as digital calibration bits that adjust a reference voltage generator circuit in the voltage regulator 114 to output the reference voltage value.

The knowledge base 118 may be periodically updated to incorporate bug fixes, add new features, include additional voltage regulators, and for other reasons. In one embodiment, an update for the knowledge base 118 is received by the computer 100 from a remote server computer over the Internet.

Figure 2:
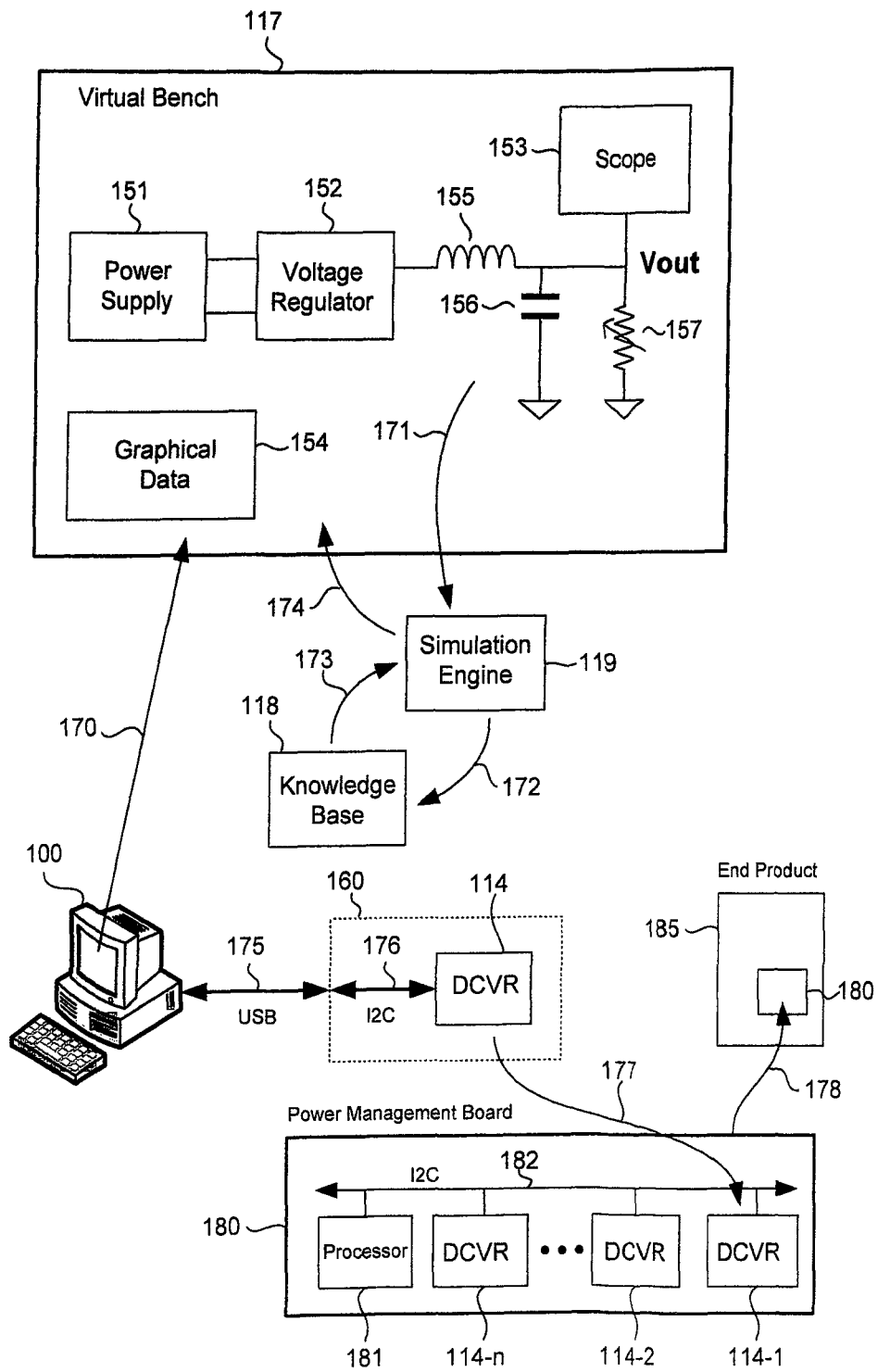
FIG. 2 schematically illustrates operation of a system for digitally calibrating a voltage regulator in accordance with an embodiment of the present invention.

FIG. 2 schematically illustrates operation of a system for digitally calibrating a voltage regulator in accordance with an embodiment of the present invention. In the example of FIG. 2, the computer 100 is running the virtual bench 117, which displays a graphical user interface (see arrow 170). In the example of FIG. 2, the virtual bench 117 displays virtual representations of a power supply 151, a voltage regulator 152, an oscilloscope 153, an output inductor 155, output capacitor 156, and a virtual load 157. The voltage regulator 152 is a virtual representation of a digitally calibrated voltage regulator 114. Accordingly, in this example, the knowledge base 118 includes the application design guidelines of the voltage regulator 114. The voltage regulator 114 may be provided in integrated circuit ("IC") form.

The virtual components displayed by the virtual bench 117 may be manipulated on-screen by the user, e.g., using a mouse. The user may enter user requirements into the virtual bench 117 by selecting values for different parameters of the voltage regulator 114. The simulation engine 119 receives the user requirements (see arrow 171), consults the knowledge base 118 to determine the expected operation of the voltage regulator 114 as operated to meet the user requirements (see arrows 172 and 173), and reflects the expected operation of the voltage regulator 114 in the virtual bench 117 (see arrow 174).

The simulation engine 119 may also receive internal calibration settings from the knowledge base 118. The internal calibration settings may reflect component selections and other adjustments that need to be made in the voltage regulator 114 to operate as specified by the user in the virtual bench 117. The internal calibration settings may be in the form of digital calibration bits that when presented to the voltage regulator 114 calibrates the voltage regulator 114 in accordance with the user requirements.

As a particular example, the user may attach the virtual oscilloscope 153 on the output voltage Vout on the virtual load 157 to see the simulated output voltage waveform as determined by the simulation engine 119, resulting from selected values of the output inductor 155 and output capacitor 156. The virtual bench 117 may provide resulting graphical data 154, such as Bode plots, for example.

The user may initiate digital calibration of the voltage regulator 114 after he is satisfied with its simulated operation. To do so, the user may install the voltage regulator 114 in a calibration board 160 or other circuit board or fixture. In one embodiment, the virtual bench 117 stores the internal calibration settings for digitally calibrating the voltage regulator 114 in accordance with the selections made by the user in the virtual bench 117. For example, the virtual bench 117 may receive the internal calibration settings from the simulation engine 119, which receives the internal calibration settings from the knowledge base 118. When the user initiates digital calibration, e.g., by clicking on an icon on the virtual bench 117, the virtual bench 117 may download the internal calibration settings to the voltage regulator 114. In the example of FIG. 2, the internal calibration settings are transferred from the computer 100 to the voltage regulator 114 over a USB 175. The calibration board 160 converts signals of the USB 175 to I2C bus 176 compatible signals, which are received by the voltage regulator 114. The voltage regulator 114 performs calibration in accordance with the internal calibration settings. The internal calibration settings may comprise digital calibration bits that select and deselect components in the voltage regulator 114 to select electrical values, such as resistance and capacitance, to make the voltage regulator operate as specified by the user in the virtual bench 117. The digital calibration bits may also set reference voltages, threshold values, programmable clock frequencies, etc. As a particular example, the calibration bits may configure a digital-to-analog converter (DAC) in the voltage regulator 114 to output a reference voltage Vr to adjust the output voltage Vout to a value specified by the user in the virtual bench 117.

In the example of FIG. 2, the voltage regulator 114 is installed in a power management board 180 after digital calibration (see arrow 177). As can be appreciated, in other embodiments, the voltage regulator 114 may also be digitally calibrated while installed in the power management board 180 instead of in the calibration board 160.

In the example of FIG. 2, the power management board 180 comprises a processor 181 and a plurality of digitally calibrated voltage regulators 114 (i.e., 114-1, 114-2, . . . , 114-n). The processor 181 may comprise a microprocessor or a microcontroller, for example. Other components of the power management board not necessary to understand the present invention are not shown or described in the interest of clarity. In the example of FIG. 2, the power management board 180 includes an I/O bus in the form of an I2C bus 182. A voltage regulator 114 may communicate with the processor 181 over the bus 182. In one embodiment, a voltage regulator 114 reports internal conditions, such as output voltage, junction temperature, output current, etc., to the processor 181 for remote monitoring. As a particular example, the voltage regulator 114 may include an analog-to-digital converter (ADC) that converts output voltage to digital form for reporting to the processor 181. The power management board 180 is subsequently installed in an end product 185, such as a consumer electronic device (see arrow 178). The end product 185 may be a mobile phone, portable media player, tablet, computer, or other electronic devices.

Figure 3:
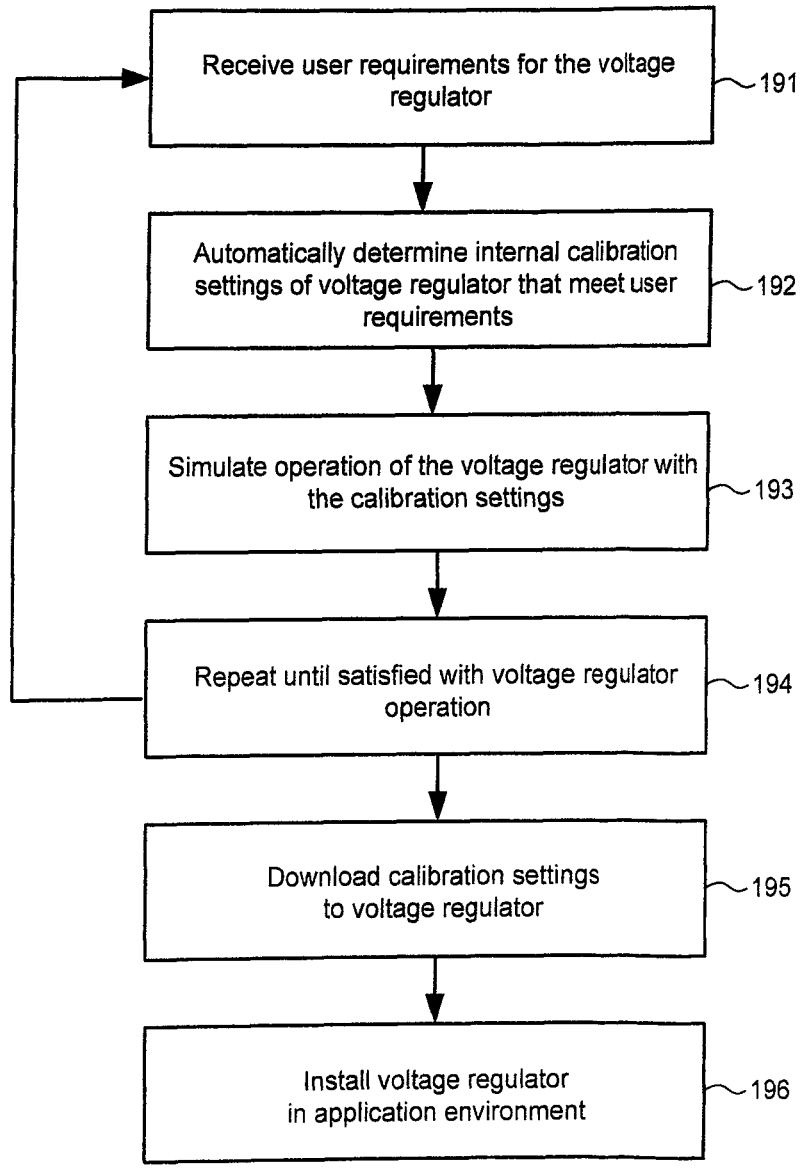
FIG. 3 shows a flow diagram of a method of digitally calibrating a voltage regulator in accordance with an embodiment of the present invention.

FIG. 3 shows a flow diagram of a method of digitally calibrating a voltage regulator in accordance with an embodiment of the present invention. The method of FIG. 3 is explained using the components shown in FIG. 2 for illustration purposes only.

In the example of FIG. 3, the virtual bench 117 receives user requirements, such as output voltage and switching frequency, for a digitally calibrated voltage regulator 114 (step 191). The virtual bench 117 passes the user requirements to the simulation engine 119, which consults with the knowledge base 118 to automatically determine internal calibration settings for the voltage regulator 114 that meet the user requirements (step 192). The internal calibration settings may be in the form of calibration bits that select electrical values or components to calibrate circuits of the voltage regulator 114. For example, the internal calibration settings my enable or disable (e.g., by opening or closing) switch elements in the voltage regulator 114. The simulation engine 119 simulates the operation of the voltage regulator 114 as calibrated with the internal calibration settings (step 193). The process of receiving user requirements, determining the corresponding internal calibration settings, and simulating the operation of the voltage regulator 114 with the internal calibration settings is repeated until the user is satisfied with the simulated operation of the voltage regulator 114 (step 194). Thereafter, the internal calibration settings are downloaded to the voltage regulator, for example as mounted in the calibration board 160 or in the power management board 180 (step 195). The voltage regulator 114 is then installed in the application environment, which may be the end product 185 (step 196).

Figure 4:
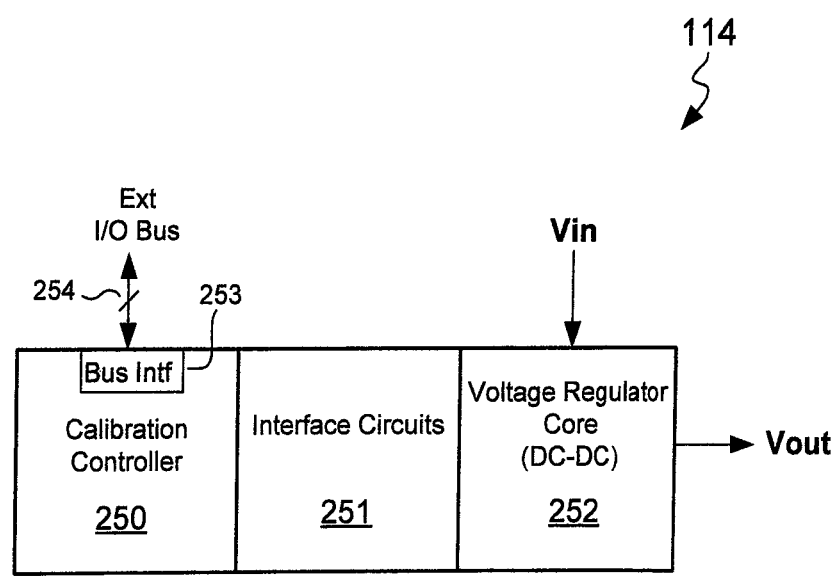
FIG. 4 shows a schematic diagram of a digitally calibrated voltage regulator in accordance with an embodiment of the present invention.

Referring now to FIG. 4, there is shown a schematic diagram of a digitally calibrated voltage regulator 114 in accordance with an embodiment of the present invention. The voltage regulator 114 may be packaged as an IC. In the example of FIG. 4, the voltage regulator 114 comprises a digital calibration controller 250, a plurality of interface circuits 251, and a voltage regulator core comprising a DC-DC converter 252. The DC-DC converter 252 comprises a step-down DC-DC converter that converts an input voltage Vin to a tightly regulated output voltage Vout. In other embodiments, the DC-DC converter 252 is replaced with other voltage regulators, including a step up DC-DC converter.

The calibration controller 250 may comprise electrical circuitry that receives internal calibration settings over an external I/O bus 254 and outputs digital calibration bits in accordance with the internal calibration settings. The digital calibration bits may be applied to the DC-DC converter 252 by way of the interface circuits 251. The calibration controller 250 may also receive internal operating conditions of the voltage regulator 114 and provide the internal operating conditions to an external circuit that performs remote monitoring, such as the processor 181 of the power management board 180, for example.

The interface circuits 251 may comprise one or more electrical circuits that provide hooks for calibrating the voltage regulator 114 in accordance with digital calibration bits received from the calibration controller 250. The interface circuits 251 may set a setting of the voltage regulator in accordance with the digital calibration bits. In one embodiment, the interface circuits 251 convert digital calibration bits to electrical values in the voltage regulator 114. As a particular example, the interface circuits 251 may comprise digitally controlled switch elements for selecting and deselecting components to change electrical values, such as capacitance and resistance that adjust gains, poles, zeros, and other parameters of the voltage regulator 114. The switch elements may comprise transistors that are switched on or off to open or close. A switch element across a component may be closed to short the component out of a circuit, or opened to add the component to the circuit. A switch element in series with a component may be opened to remove the component from the circuit, or closed to add the component to the circuit. The interface circuits 251 may also comprise programmable components and components that convert digital calibration bits to electrical values. For example, the interface circuits 251 may comprise DACs, programmable clocks, and the like.

Figure 5:
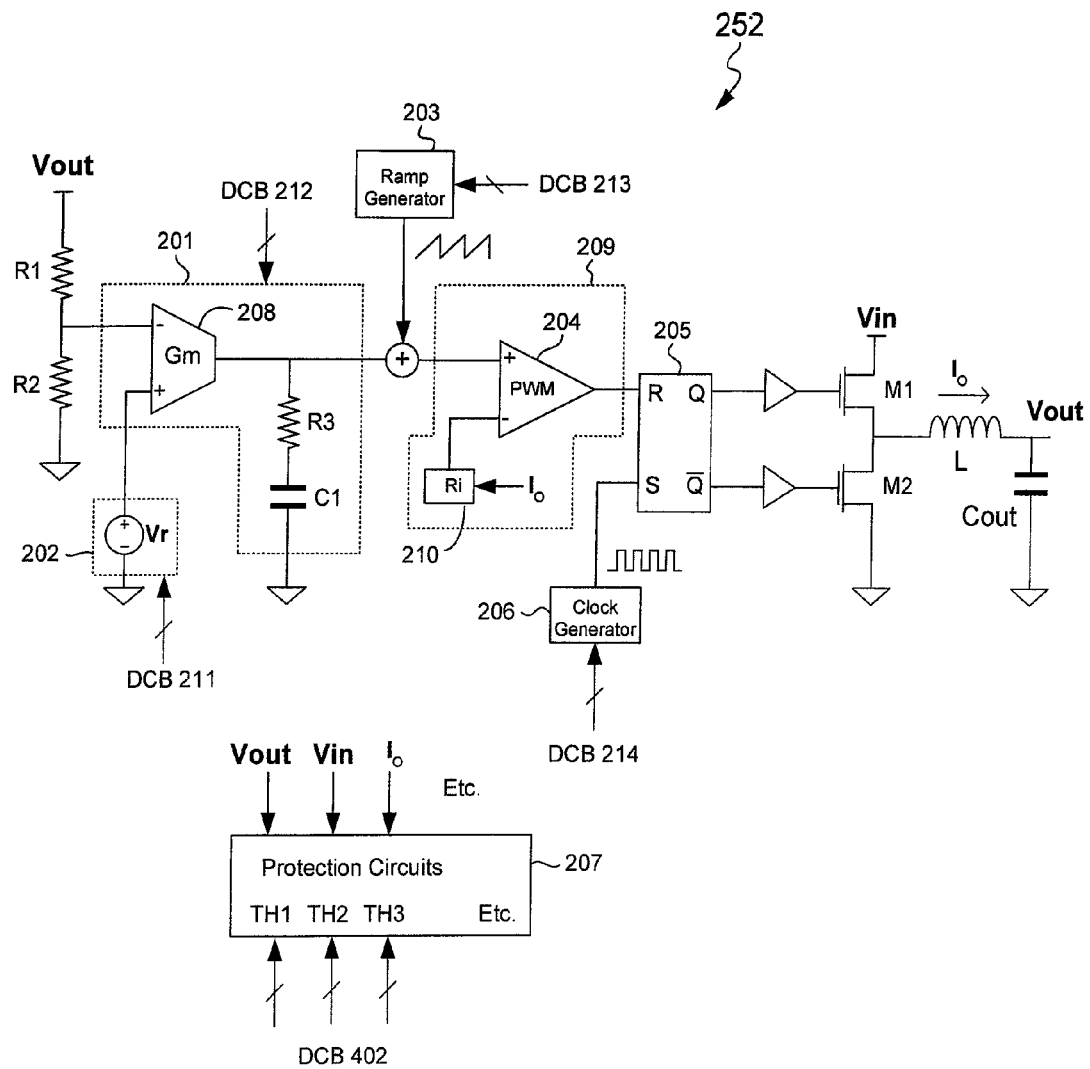
FIG. 5 shows a schematic diagram of an example voltage regulator core in accordance with an embodiment of the present invention.

FIG. 5 shows a schematic diagram of an example voltage regulator core in the form of the DC-DC converter 252 in accordance with an embodiment of the present invention. It is to be noted that the DC-DC converter 252 is provided merely to provide an illustrative example, and not as a limitation.

In the example of FIG. 5, the DC-DC converter 252 receives the input voltage Vin and generates the regulated step-down output voltage Vout by controlling the switching of the transistors M1 and M2. The feedback control loop of the DC-DC converter 252 includes an output voltage sensing circuit in the form of a resistive divider comprising resistors R1 and R2. The resistive divider provides a sensed output voltage indicative of the output voltage Vout to a loop control module 201, which in one embodiment comprises a transconductance amplifier 208 and a loop filter comprising a resistor R3 and a capacitor C1. The transconductance amplifier 208 compares the sensed output voltage to a reference voltage Vr. The resistor R3 and the capacitor C1 serve a proportional-integral-derivative (PID) function on the output of the transconductance amplifier 208, which is summed with a ramp reference signal generated by a ramp generator 203. The resulting ramp signal at the output of the summer is presented to a pulse-width-modulation (PWM) module 209 comprising a PWM amplifier 204 and a gain block 210. The PWM module 209 receives a sensed output current Io, which may be amplified by the gain block 210 having a resistance Ri to convert the sensed output current Io to a voltage value that may be compared to the ramp signal. The PWM amplifier 204 compares the sensed output current Io to the ramp signal to control when to turn OFF the transistor M1 and turn ON the transistor M2. A clock generator 206 generates a clock signal that periodically turns ON the transistor M1 and turns OFF the transistor M2. The clock signal controls the switching frequency of the voltage regulator 114. The outputs of the clock generator 206 and the PWM amplifier 204 are input to a flip-flop 205, which drives the transistors M1 and M2.

In the example of FIG. 5, the output voltage Vout may be calibrated to meet user requirements by changing the value of the reference voltage Vr presented to the transconductance amplifier 208. The reference voltage Vr may be provided by a digitally settable reference voltage generator 202. The reference voltage generator 202 may receive digital calibration bits (DCB) 211 from the calibration controller 250, and set the value of the reference voltage Vr in accordance with the digital calibration bits 211 to generate an output voltage Vout specified by the user in the virtual bench 117.

The loop control module 201 may receive digital calibration bits 212 from the calibration controller 250. The loop control module 201 may adjust the equivalent resistance of the resistor R3, equivalent capacitance of the capacitor C1, the gain of the transconductance amplifier 208, and other electrical values that are settable in the control module 201 in accordance with the digital calibration bits 212 to set poles, zeros, and other parameters in accordance with user requirements entered in the virtual bench 117.

The ramp generator 203 may receive digital calibration bits 213 from the calibration controller 250. The ramp generator 203 may adjust the slope and other parameters of its output ramp reference signal in accordance with the digital calibration bits 213 to meet user requirements entered in the virtual bench 117.

The clock generator 214 may receive digital calibration bits 214 from the calibration controller 250. The clock generator may change the frequency and other parameters of its output clock signal in accordance with the digital calibration bits 214 to set the switching frequency of the voltage regulator 114 as specified by the user in the virtual bench 117.

The voltage regulator 114 may further include protection circuits 207, such as an under voltage lockout (UVLO) circuit, over voltage protection circuit, over current protection circuit, and other protection circuits typically provided in a voltage regulator. The protection circuits 207 may perform their function by receiving sensed output voltage, sensed input voltage, sensed output current, and other signals that are monitored. The thresholds (e.g., TH1, TH2, TH3, etc.) for triggering the protection circuits may be set by corresponding digital calibration bits 402 from the calibration controller 250 in accordance with user requirements entered in the virtual bench 117.

Figure 6:
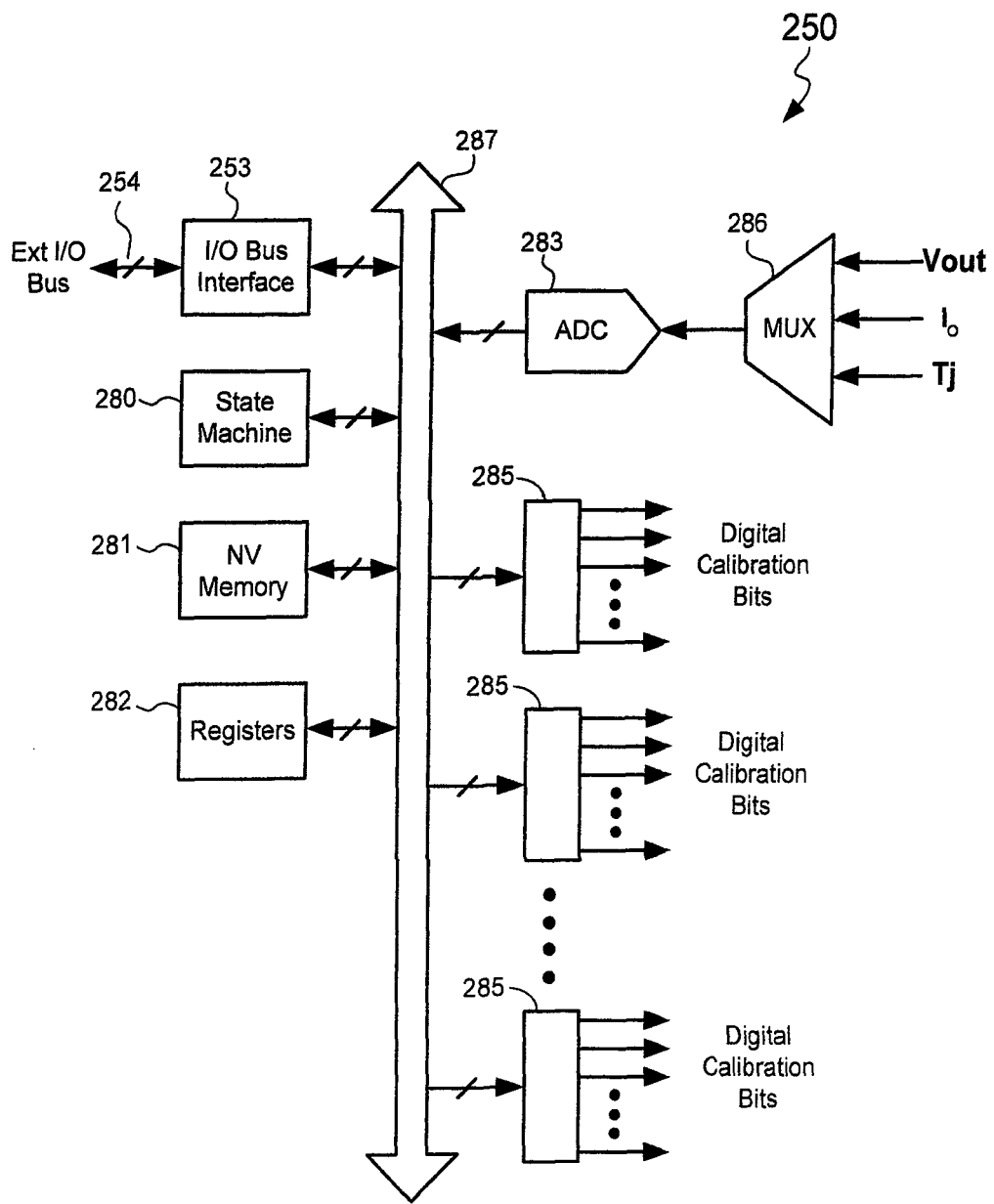
FIG. 6 shows a schematic diagram of a calibration controller in accordance with an embodiment of the present invention.

FIG. 6 shows a schematic diagram of the calibration controller 250 in accordance with an embodiment of the present invention. In the example of FIG. 6, the calibration controller 250 includes an I/O bus interface 253 that performs serial to parallel conversion. In one embodiment, the I/O bus interface 253 communicates with a serial external I/O bus 254 comprising an I2C bus. The calibration controller 250 may communicate over the external I/O bus 254 to receive internal calibration settings from the computer 100. The calibration controller 250 may also communicate over the external I/O bus 254 to send remote monitoring signals to the processor 181 of the power management board 180. Components of the calibration controller 250 that are not necessary to the understanding of the present invention, such as clocks, glue logic, and internal buffers, are not shown in the interest of clarity. The components of the calibration controller 250 may communicate over an internal bus 287.

In one embodiment, the calibration controller 250 includes a controller in the form of a state machine 280. The state machine 280 may be implemented using a gate array, flip-flops, programmable logic, and other logic means. The state machine 280 may also be implemented using a microcontroller, microprocessor, digital signal processor, or other processor depending on cost considerations.

The state machine 280 may be configured to receive an internal calibration setting over the I/O bus interface 253, and sequence through a series of predetermined states to output corresponding digital calibration bits in accordance with the internal calibration settings. In one embodiment, the state machine 280 sends out the corresponding digital calibration bits over the internal bus 287 to one or more digital output ports 285. A digital output port 285 may be coupled to one or more components of an interface circuit 251. As can be appreciated, the state machine 280 does not need much computing power because most of the processing in determining which digital calibration bits need to be selected (e.g., set to logic HIGH) or deselected (e.g., set to logic LOW) may be performed by the virtual bench 117, knowledge base 118, and simulation ancient 119 in the computer 100. The state machine 280 simply needs to cycle through predetermined states to select and deselect digital calibration bits as indicated in the received internal calibration settings.

The calibration controller 250 may be configured to provide remote monitoring functions. In the example of FIG. 6, the calibration controller 250 receives sensed voltage, current, temperature, or other monitored condition in the voltage regulator 114 by way of the multiplexer 286. The selected sensed condition is output by the multiplexer 286 to the input of an ADC 283, which converts the sensed condition to digital form suitable for transmission to an external processor, such as the processor 181 of the power management board 180. For example, the state machine 280 may receive a request from the processor 181 to provide the present value of a sensed condition, such as the output voltage (Vout), output current (Io), or a junction temperature (Tj). In response to the request, the state machine 280 may cycle through predetermined states to select the particular sensed condition from the input of the multiplexer 286, to retrieve the digital value of the sensed condition from the ADC 283, and to transfer the digital value of the sensed condition to the processor 181 by way of the external I/O bus interface 253. The state machine 280 may use the memory storage space provided by the nonvolatile memory 281 and banks of registers 282 as temporary workspace and general storage.

Figure 7:
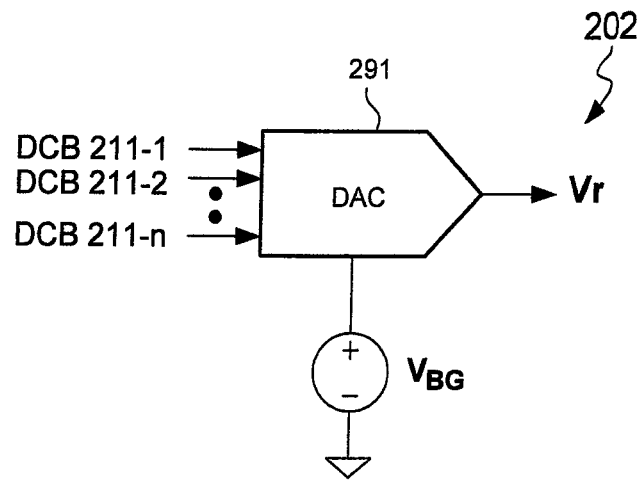
FIG. 7 shows a schematic diagram of a digitally settable reference circuit in accordance with an embodiment of the present invention.

FIG. 7 shows a schematic diagram of the digitally sellable reference circuit 202 in accordance with an embodiment of the present invention. In the example of FIG. 7, the reference circuit 202 comprises a DAC 291 having a band gap reference voltage VBG for reference. The DAC 291 receives digital calibration bits 211 (i.e., 211-1, 211-2, . . . , 2111-n) from the calibration controller 250 as inputs, and converts the value of the digital calibration bits 211 to analog form, which in the example of FIG. 7 is the reference voltage Vr. The reference voltage Vr may thus be adjusted by appropriate changes to the digital calibration bits 211. The reference voltage Vr, which is presented to the input of the transconductance amplifier 208, controls the output voltage Vout by being compared to the sensed output voltage Vout (see FIG. 5). Accordingly, the digital calibration bits 211 may have a bit pattern that results in a particular output voltage Vout specified by the user.

Figure 8:
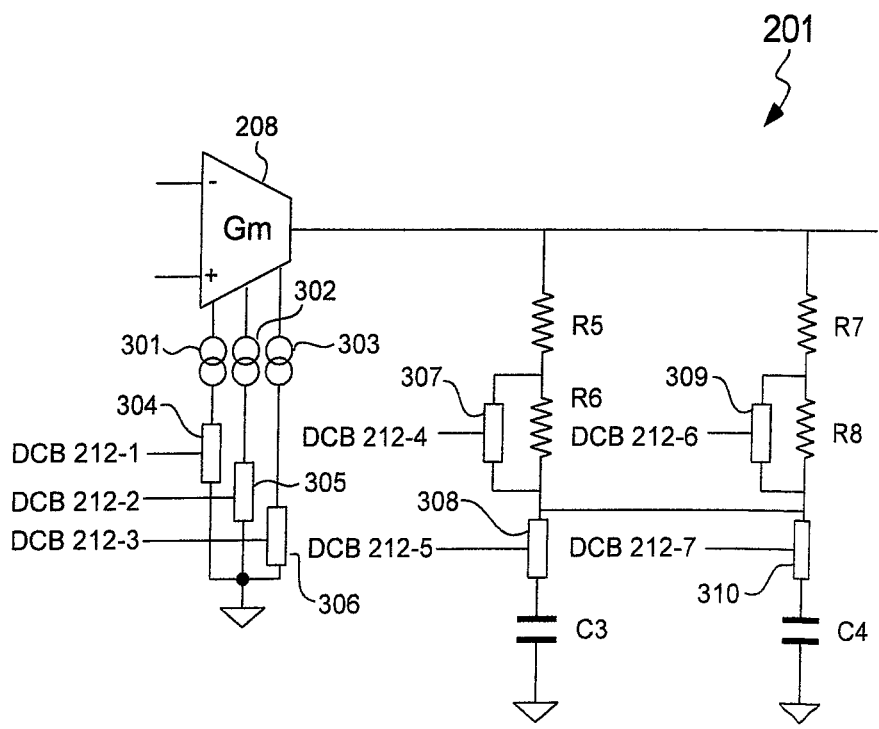
FIG. 8 shows a schematic diagram of a loop control module in accordance with an embodiment of the present invention.

FIG. 8 shows a schematic diagram of the loop control module 201 in accordance with an embodiment of the present invention. In the example of FIG. 8, the digital calibration bits 212 (i.e., 212-1, 212-2, etc.), which are received by the control module 201 from the calibration controller 250, controls switch elements 304-310. A switch element may comprise a transistor or other device that may be closed or opened depending on a control input, which in this example is a digital calibration bit. In the following examples, a logic HIGH digital calibration bit closes a switch element and a logic LOW digital calibration bit opens the switch element.

In the example of FIG. 8, some of the digital calibration bits 212 are employed to adjust the gain of the transconductance amplifier 208 by controlling the tail current of the transconductance amplifier 208. In particular, in the example of FIG. 8, the digital calibration bits 212-1, 212, and 212-3 control the opening and closing of the switch elements 304, 305, and 306, respectively. The value of the tail current of the transconductance amplifier 208, and thus its gain, may be adjusted by adding or removing the current source 301, current source 302, and/or the current source 303 to the tail current. For example, setting the digital calibration bit 212-1 to be at logic HIGH closes the switch element 304 to add the current source 301 to the tail current of the transconductance amplifier 208. Similarly, setting the digital calibration bit 212-1 to be at logic LOW opens the switch element 304 to remove the current source 301 from the tail current of the transconductance amplifier 208.

Switch elements may also be employed to add or remove components to change equivalent component values. For example, resistors R6 and R8 and capacitors C3 and C4 may be added or removed from the loop control module 201 to change the poles and zeros of the control loop. More specifically, the digital calibration bit 212-4 may be set to logic HIGH to close the switch element 307 and thereby, in effect, remove the resistor R6. Setting the digital calibration bit 212-4 to a logic LOW opens the switch element 307 to add the resistance of the resistor R6 in series with the resistor R5. Similarly, the digital calibration bit 212-7 may be set to a logic HIGH or logic LOW to add or remove the capacitor C4. Particular bit patterns of the digital calibration bits 212 may therefore be presented to the control module 201 to adjust the gain of the transconductance amplifier 208 and the poles and zeros of the control loop to meet particular requirements. As can be appreciated, the bit patterns of the digital calibration bits 212 for particular requirements may be generated by the simulation engine 119 in consultation with the knowledge base 118, received by the calibration controller 250, and output by the calibration controller 250 to the loop control module 201 by way of interface circuits, which in the example of FIG. 8 comprise switch elements 304-310.

Figure 9:
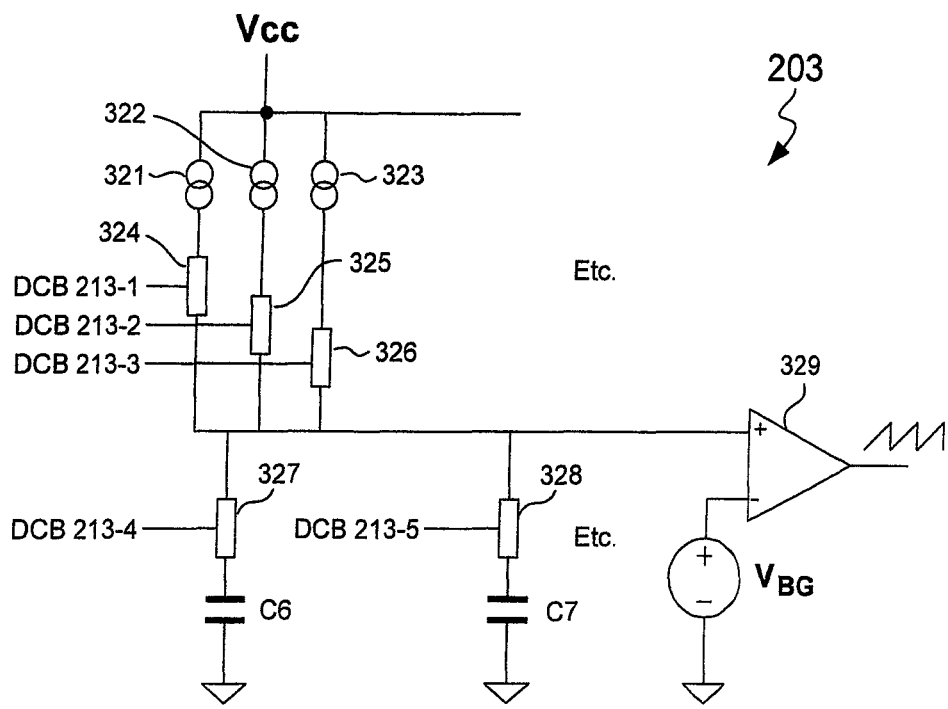
FIG. 9 shows a schematic diagram of a ramp generator in accordance with an embodiment of the present invention.

FIG. 9 shows a schematic diagram of the ramp generator 203 in accordance with an embodiment of the present invention. In the example of FIG. 9, the ramp generator 203 receives digital calibration bits 213 (i.e. 213-1, 213-2, etc.) from the calibration controller 250. The bit pattern of the digital calibration bits 213 opens and closes the switch elements 324-328 to adjust the slope of the ramp reference signal provided at the output of the amplifier 329. In particular, the switch elements 324-326 may be controlled by the digital calibration bits 213-1, 213-2, and 213-3 to add or remove the current sources 321 322, and 323, respectively. The switch elements 327 and 328 may be controlled by the digital calibration bits 213-4 and 213-5 to add or remove the capacitors C6 and C7, respectively. The amplifier 329 compares the resulting signal to a bandgap voltage VBG to generate the ramp reference signal. Particular bit patterns of the digital calibration bits 213 may therefore be presented to the ramp generator 203 to adjust the slope of the ramp reference signal to meet particular requirements.

Figure 10:
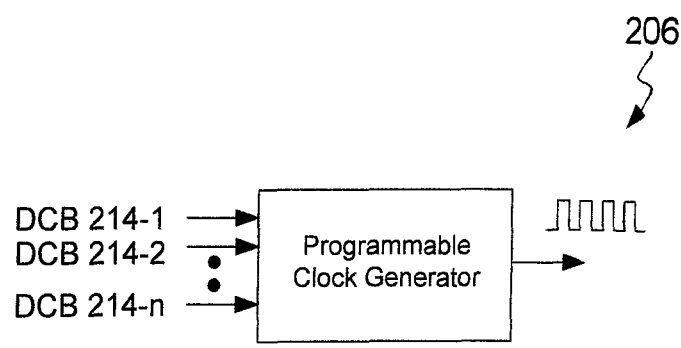
FIG. 10 shows a schematic diagram of a clock generator in accordance with an embodiment of the present invention.

FIG. 10 shows a schematic diagram of the clock generator 206 in accordance with an embodiment of the present invention. In the example of FIG. 10, the clock generator 206 is a programmable clock generator that receives digital calibration bits 214 (i.e., 214-1, 214-2, . . . , 214-n) from the calibration controller 250. The clock generator 206 outputs a clock signal having a frequency dictated by the digital calibration bits 214. Accordingly, the clock signal, and therefore the switching frequency of the voltage regulator 114, may be set to meet particular requirements by providing a particular bit pattern to the inputs of the clock generator 206.

Figure 11:
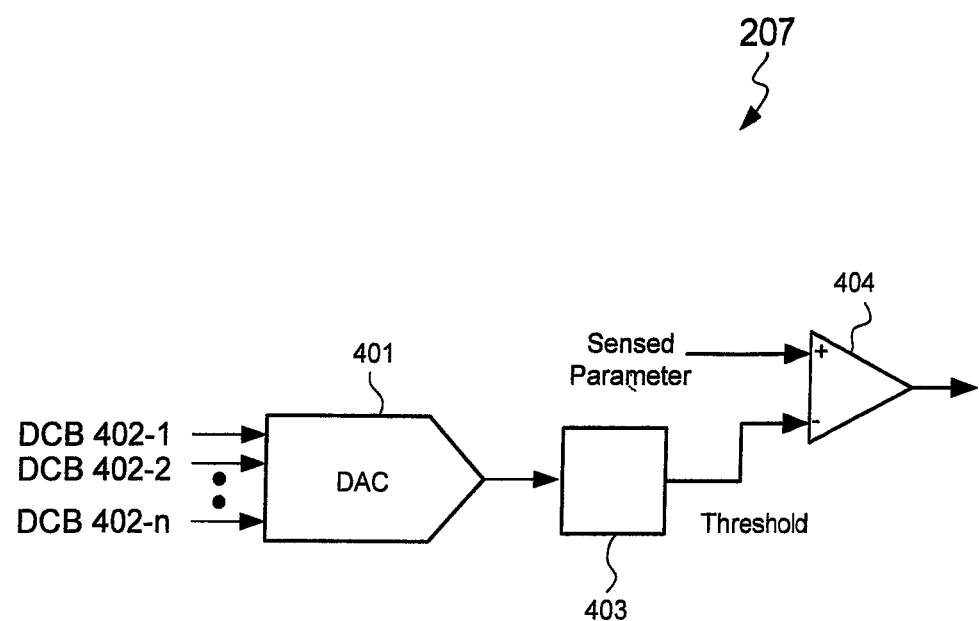
FIG. 11 shows a schematic diagram of an example protection circuit in accordance with an embodiment of the present invention.

FIG. 11 shows a schematic diagram of an example protection circuit 207 in accordance with an embodiment of the present invention. In general, a protection circuit 207 may include a comparator 404 for comparing a sensed parameter to a threshold. The threshold may be calibrated by presenting a bit pattern of the digital calibration bits 402 (i.e., 402-1, 402-2, . . . , 402-n) received from the calibration controller 250 to the inputs of a DAC 401, which outputs a corresponding threshold value. The output of the DAC 401 may be scaled or pre-processed (e.g., converted to current or voltage) by a pre-processing block 403 before being presented to the comparator 404. The comparator 404 may be a voltage or current comparator depending on the sensed parameter. For example, assuming the protection circuit 207 is an overvoltage protection circuit, the sensed parameter may comprise output voltage and the comparator 404 may be a voltage comparator. The pre-processing block 403 may be a gain or divider block to scale the output of the DAC 401. The pre-processing block 403 may also be omitted in that case.

As another example, assuming the protection circuit 207 is an overcurrent protection circuit, the sensed parameter may comprise output current and the comparator 404 may comprise a current comparator. The pre-processing block 403 may comprise a voltage to current converter to convert the output of the DAC 401 to a current output. Alternatively, the comparator 404 may receive the sensed parameter as a voltage indicative of output current (e.g., voltage drop of the output current on a resistor). In that case, the sensed parameter is compared to a threshold voltage set by the output of the DAC 401 in accordance with the bit pattern of the input digital calibration bits 402.

Digitally calibrated voltage regulators and methods for using same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of digitally calibrating a voltage regulator, the method comprising:
   receiving, in a computer, a user requirement for a voltage regulator;
   automatically determining an internal calibration setting for the voltage regulator to meet the user requirement;
   simulating, in the computer, operation of the voltage regulator with the internal calibration setting;
   after simulating the operation of the voltage regulator, providing the internal calibration setting from the computer to the voltage regulator;
   receiving the internal calibration setting in a calibration controller of the voltage regulator; and
   calibrating the voltage regulator by applying digital calibration bits to an interface circuit of the voltage regulator in accordance with the internal calibration setting.

2. The method of claim 1, wherein the user requirement is an output voltage value and applying the digital calibration bits to the interface circuit comprises presenting the digital calibration bits to inputs of a digital to analog converter (DAC) to change the output of the DAC.

3. The method of claim 1, wherein the user requirement is related to a pole or zero of a control loop of the voltage regulator and applying the digital calibration bits to the interface circuit comprises adding or removing components in a loop control module.

4. The method of claim 1, further comprising:
   installing the voltage regulator in an end product after digitally calibrating the voltage regulator.

5. The method of claim 1, wherein the internal calibration setting is downloaded to the voltage regulator in a calibration board.

6. The method of claim 1, wherein receiving the user requirement for the voltage regulator comprises:
   receiving the user requirement from a graphical user interface displaying a virtual representation of the voltage regulator.

7. The method of claim 1, wherein the voltage regulator is a step-down DC-DC converter and the internal calibration setting is received in the calibration controller of the DC-DC converter.

8. The method of claim 1, wherein applying the digital calibration bits to the interface circuit of the voltage regulator includes controlling a switch element to select or deselect a component in the voltage regulator.

9. The method of claim 1, wherein receiving the internal calibration setting in the calibration controller of the voltage regulator comprises the calibration controller receiving the internal calibration setting over an external I/O bus.

10. The method of claim 9, wherein the external I/O bus is a serial bus and the calibration controller performs serial to parallel bus conversion.

11. A method of calibrating a voltage regulator, the method comprising:
    displaying a graphical user interface that shows a virtual representation of a voltage regulator on a screen of a computer;
    selecting, by way of the graphical user interface, a value for a parameter of the voltage regulator;
    simulating operation of the voltage regulator on the computer in accordance with the selected value for the parameter of the voltage regulator;
    after simulating the operation of the voltage regulator, transmitting an internal calibration setting from the computer to the voltage regulator, the internal calibration setting comprising data for making the voltage regulator operate in accordance with the selected value for the parameter of the voltage regulator;
    receiving the internal calibration settings in the voltage regulator; and
    calibrating the voltage regulator in accordance with the internal calibration setting.

12. The method of claim 11, wherein the parameter of the voltage regulator includes switching frequency of the voltage regulator.

13. The method of claim 11, wherein transmitting the internal calibration setting from the computer to the voltage regulator comprises:
    installing the voltage regulator in a calibration board;
    connecting the calibration board to the computer; and
    downloading the calibration settings from the computer to the calibration board.

14. The method of claim 13, further comprising:
    after calibrating the voltage regulator, transferring the voltage regulator from the calibration board to an end product.

15. The method of claim 14, wherein the end product comprises a power supply.

* * * * *